United States Patent [19]

Kobayashi et al.

[11] Patent Number: 5,349,205
[45] Date of Patent: Sep. 20, 1994

[54] THIN-FILM TRANSISTOR ARRAY WITH ANODIC OXIDE FOR USE IN A LIQUID CRYSTAL DISPLAY

[75] Inventors: Ikunori Kobayashi, Sakai; Kazuyoshi Nakamura, Kadoma; Koji Matsunaga, Katano; Mamoru Takeda, Hirakata; Tomizo Matsuoka, Neyagawa, all of Japan

[73] Assignee: Matsushita Electric Industrial Co., Ltd., Osaka, Japan

[21] Appl. No.: 983,826

[22] Filed: Dec. 1, 1992

[30] Foreign Application Priority Data

Dec. 2, 1991 [JP] Japan .................. 3-317699
Dec. 27, 1991 [JP] Japan .................. 3-347182
Sep. 22, 1992 [JP] Japan .................. 4-252593

[51] Int. Cl.$^5$ ............................. H01L 27/01
[52] U.S. Cl. ........................... 257/59; 257/99; 257/412; 257/764; 257/765; 359/54; 359/55; 359/87; 359/88
[58] Field of Search ............ 257/59, 91, 99, 771, 257/412, 765, 764, 758, 760; 359/54, 55, 87, 88, 89

[56] References Cited

U.S. PATENT DOCUMENTS

| | | | |
|---|---|---|---|
| 5,036,370 | 7/1991 | Miyago et al. | 257/412 X |
| 5,066,106 | 11/1991 | Sakamoto et al. | 257/59 X |
| 5,162,933 | 11/1992 | Kakuda et al. | 359/87 X |
| 5,177,577 | 1/1993 | Taniguchi et al. | 257/59 |
| 5,187,602 | 2/1993 | Ikeda et al. | 359/87 X |

FOREIGN PATENT DOCUMENTS

| | | |
|---|---|---|
| 0301571 | 2/1989 | European Pat. Off. |
| 0407168 | 1/1991 | European Pat. Off. |
| 0476701 | 3/1992 | European Pat. Off. |
| 55-138257 | 10/1980 | Japan |
| 61-220456 | 9/1986 | Japan |
| 1120068 | 12/1989 | Japan |
| 4-116524 | 4/1992 | Japan |
| 4-130776 | 5/1992 | Japan |
| 4188770 | 7/1992 | Japan |

*Primary Examiner*—William Mintel
*Attorney, Agent, or Firm*—Ratner & Prestia

[57] ABSTRACT

A thin-film transistor array is suited for the manufacture of an image display utilizing liquid crystal. In the thin-film transistor array, a first electrically conductive layer made principally of aluminum is selectively formed on one surface of a substrate. The first electrically conductive layer contains, as an impurity, a high-melting point metal which can be anodized. An oxide layer is formed by an anodization process on the first electrically conductive layer, and the first insulating layer is formed on the oxide layer so as to overlay the substrate. Furthermore, a first semiconductor layer made principally of silicon is selectively formed on the insulating layer, and a pair of second semiconductor layers made principally of silicon containing phosphorus are formed on the first semiconductor layer. A pair of second electrically conductive layers are formed on the paired second semiconductor layers, respectively.

15 Claims, 3 Drawing Sheets

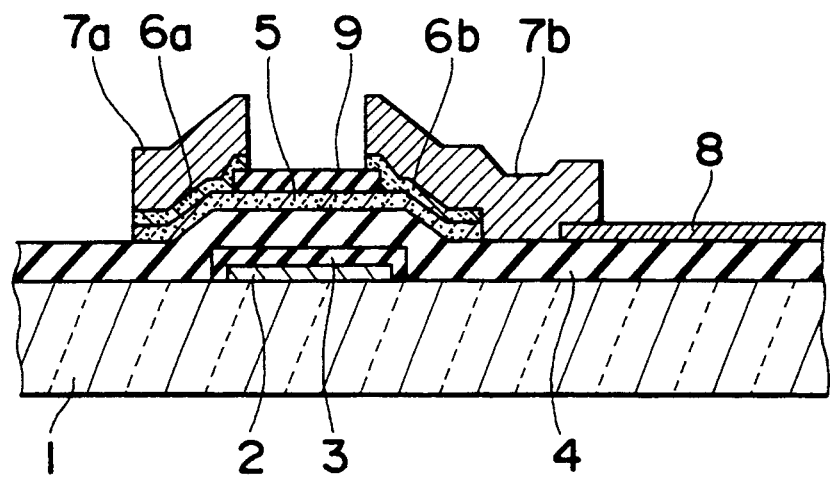
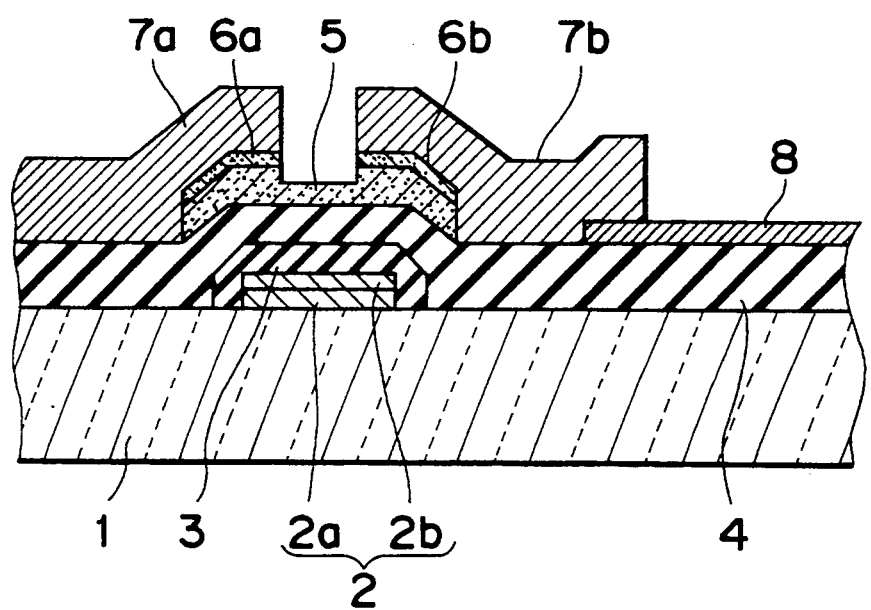

THIN-FILM TRANSISTOR ARRAY WITH ANODIC OXIDE FOR USE IN A LIQUID CRYSTAL DISPLAY

BACKGROUND OF THE INVENTION

1. Field of the Invention

The present invention relates generally to a thin-film transistor array suitable for the manufacture of an image display utilizing liquid crystal, and more particularly to a gate electrode of the thin-film transistor array.

2. Description of the Prior Art

Of various thin-film displays currently available in the market, liquid crystal displays are highly evaluated because they consume a minimized amount of electric power and can readily be fabricated into a color version faithful to present full-color images. In these days, development of large-sized display screens is actively being pursued.

A thin-film transistor array (hereinafter referred to simply as a TFT array) employed in conventional liquid crystal displays generally comprises a glass substrate, a gate electrode made of, for example, aluminum formed on the glass substrate, and a first amorphous silicon semiconductor layer formed on the gate electrode via a silicon nitride gate insulating film. The TFT array also comprises a source electrode and a drain electrode both formed on the first amorphous silicon semiconductor layer via a second amorphous silicon semiconductor layer containing phosphorus, and a transparent display electrode formed on the gate insulating film in electrically connected fashion with the drain electrode and used for applying a voltage to liquid crystal. Each of the source electrode and the drain electrode is of a double-layered structure including a layer of titanium (Ti) and that of aluminum (Al). In the above-described construction, the surface of the gate electrode is occasionally covered with an Al oxide, thereby enhancing insulating properties.

The TFT array having the above-described construction is manufactured as follows. The glass substrate is initially covered with an Al film, which is in turn configured into the gate electrode by the use of a photolithography technique and by etching. In applications where the Al gate electrode is covered with an Al oxide, an anodization process is effectively utilized. The main materials of the TFT, i.e., the gate insulating film of a silicon nitride (SiNx), the first amorphous silicon (a-Si) semiconductor layer, and the second amorphous silicon (n+-a-Si) semiconductor layer provided to obtain ohmic contact between the source or drain electrode and the first semiconductor layer are successively formed utilizing the CVD (chemical vapor deposition) method. A portion of the first (a-Si) semiconductor layer and that of the second (n+-a-Si) semiconductor layer other than those portions thereof which do constitute the TFT are then removed by etching. Thereafter, an indium tin oxide (ITO) is formed on the gate insulating film and is configured into a transparent display electrode by the photolithography and by etching. Then, an opening is formed which extends through the gate insulating film to obtain electrical contact between the gate electrode and a source wiring. Thereafter, a Ti film and an Al film are formed in this order and are configured into the source and drain electrodes by the photolithography and by etching. Upon removing the second (n+-a-Si) semiconductor layer from channel portions of the TFT, the TFT array is completed.

The above-described conventional TFT array requires a heating process, which is carried out at 130° C. in the process of photolithography, in preparation for the subsequent etching required to form the gate electrode having a desired configuration, or requires a process in which the temperature of the substrate reaches 300° C. during the formation of the silicon nitride gate insulating film or the first (a-Si) semiconductor layer. Because of this, it is likely that so-called hillocks (grown-up projections) of Al are produced. If the hillocks are produced, the Al oxide formed by the anodization process cannot fully cover the projections, thereby reducing insulating properties. As a result, the problem arises that short-circuiting takes place between the gate electrode and the source electrode, or another problem arises that the Al surface of a connecting portion between the gate electrode and the source wiring falls to ruin, thereby causing contact failure.

Conventionally, in order to prevent the generation of such Al hillocks, about 2 atomic % of silicon (Si) is occasionally added as an impurity to Al. As shown in FIG. 2, however, an Al oxide formed by anodizing Al containing Si as the impurity brings about a large leakage current, and the insulating properties between layers are fairly bad. When such Al oxide is employed as an insulating film, the problem arises that shortcircuiting frequently takes place between the gate electrode and the source or drain electrode.

SUMMARY OF THE INVENTION

The present invention has been developed to overcome the above-described disadvantages.

It is accordingly an object of the present invention to provide an improved TFT array which can be manufactured at a high yield by preventing the generation of hillocks without increasing the wiring resistance.

In accomplishing the above and other objects, a TFT array according to the present invention includes a first electrically conductive layer made principally of Al and selectively formed on one surface of a substrate. The first electrically conductive layer contains, as an impurity, a high-melting point metal which can be anodized. The TFT array also includes an oxide layer formed on the first electrically conductive layer, an insulating layer formed on the oxide layer so as to overlay the substrate, and a first non-monocrystalline semiconductor layer made principally of Si and selectively formed on the insulating layer. A portion of the first non-monocrystalline semiconductor layer is positioned above the first electrically conductive layer. A pair of second non-monocrystalline semiconductor layers made principally of Si containing phosphorus are formed on the first non-monocrystalline semiconductor layer, and a pair of second electrically conductive layers are formed on the paired second non-monocrystalline semiconductor layers, respectively. At least a portion of each of the second electrically conductive layers is positioned above the first non-monocrystalline semiconductor layer.

Preferably, the high-melting point metal is any one of tantalum, titanium, molybdenum, tungsten, hafnium, niobium, zirconium, and vanadium. The first electrically conductive layer may have a gradient in concentration of the high-melting point metal, which gradually changes in a direction perpendicular thereto.

The TFT may further includes another insulating layer selectively formed on the first non-monocrystalline semiconductor layer. The oxide layer may contain, as an impurity, a high-melting point metal which can be anodized.

In another aspect of the present invention, the first electrically conductive layer is of a double-layered structure including a first layer selectively formed on one surface of the substrate and a second layer formed on the first layer. The first layer is made of Al containing at least one of Si and Cu, whereas the second layer is made of Al containing, as an impurity, a high-melting point metal which can be anodized. The first layer may be made of pure Al.

BRIEF DESCRIPTION OF THE DRAWINGS

The above and other objects and features of the present invention will become more apparent from the following description of a preferred embodiment thereof with reference to the accompanying drawings, throughout which like parts are designated by like reference numerals, and wherein:

FIG. 3 is a view similar to FIG. 1, but according to a fourth embodiment of the present invention;

FIG. 4 is a view similar to FIG. 1, but according to a fifth embodiment of the present invention;

DETAILED DESCRIPTION OF THE PREFERRED EMBODIMENTS

Figure 1:
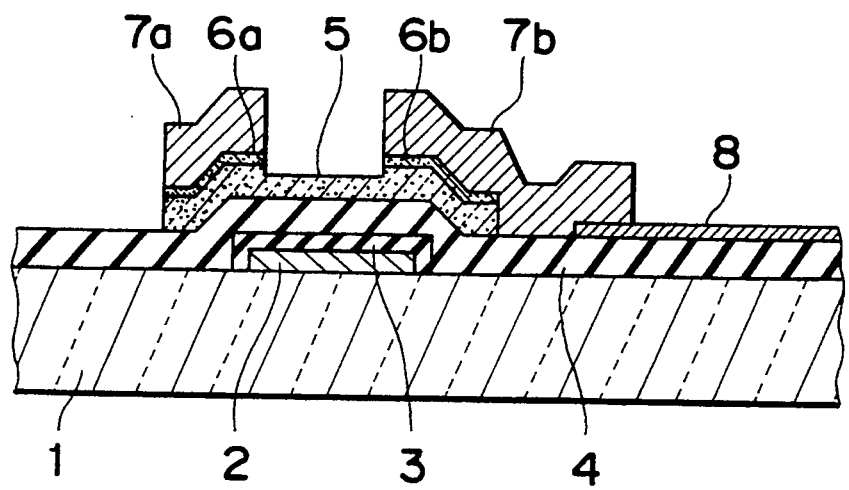
Fig. 1 is a cross-sectional view of a TFT array according to a first, second or third embodiment of the present invention.

Referring now to the drawings, there is shown in FIG. 1 a portion of a TFT array according to a first embodiment of the present invention.

In manufacturing the TFT array of FIG. 1, a gate electrode 2 having a thickness of 200 nm and made of aluminum (Al) containing 2 atomic % of tantalum (Ta) is initially formed on a glass substrate 1. In a subsequent anodization process, an Al oxide gate insulating layer 3 having a thickness of 150 nm is formed so as to cover the gate electrode 2. Then, an amorphous silicon semiconductor layer 5 is formed via a silicon (Si) nitride gate insulating film 4 having a thickness of 200 nm. On the gate insulating film 4 is also formed a transparent display electrode 8 for applying a voltage to liquid crystal. Thereafter, a source electrode 7a and a drain electrode 7b are formed via amorphous silicon semiconductor layers 6a and 6b each containing phosphorus, respectively. Finally, the drain electrode 7b is connected with the transparent display electrode 8.

Each of the source electrode 7a and the drain electrode 7b is of a double-layered structure including a titanium (Ti) layer and an Al layer. The Ti layer has a thickness of 100 nm, whereas the Al layer has a thickness of 700 nm.

More specifically, an Al film containing 2 atomic % of Ta and having a thickness of 300 nm is initially formed on the glass substrate 1 utilizing the DC sputtering process. The Al film is then configured into the gate electrode 2 by the use of a photolithography technique and by etching. Thereafter, an anodizing solution is prepared by mixing a 3% solution of ammonium borate in water with ethylene glycol at a mixing ratio of 1:9. The anodizing solution is then neutralized so as to have a PH of 6–7 and the temperature thereof is maintained at 30° C. During a subsequent anodization process in which an anodizing voltage of 105 V and an anodizing current of 5 mA/cm$^2$ are employed, an Al oxide having a thickness of 150 nm is formed. At this moment, the thickness of non-anodized Al becomes 200 nm. Thereafter, the main materials of the TFT, i.e., the silicon nitride (SiNx) gate insulating film 4, the amorphous silicon (a-Si) semiconductor layer 5, and the amorphous silicon (n+-a-Si) semiconductor layers 6a and 6b provided to obtain ohmic contact between the source or drain electrode 7a or 7b and the amorphous silicon semiconductor layer 5 are successively formed utilizing the plasma CVD method at 13.56 MHz. Unnecessary portions of the a-Si layer 5 and those of the n+-a-Si layers 6a and 6b are then removed by etching. Thereafter, an ITO film is formed utilizing the DC sputtering process and is configured into the transparent display electrode 8 by the photolithography and by etching. Then, an opening is formed which extends through the gate insulating film 4 to obtain electrical contact between the gate electrode 2 and a source wiring. Thereafter, a Ti film and an Al film are formed in this order utilizing the DC sputtering process and are configured into the source and drain electrodes 7a and 7b by the photolithography and by etching. Upon removing the n+-a-Si layers 6a and 6b from channel portions of the TFT, the TFT array is completed.

Figure 2:
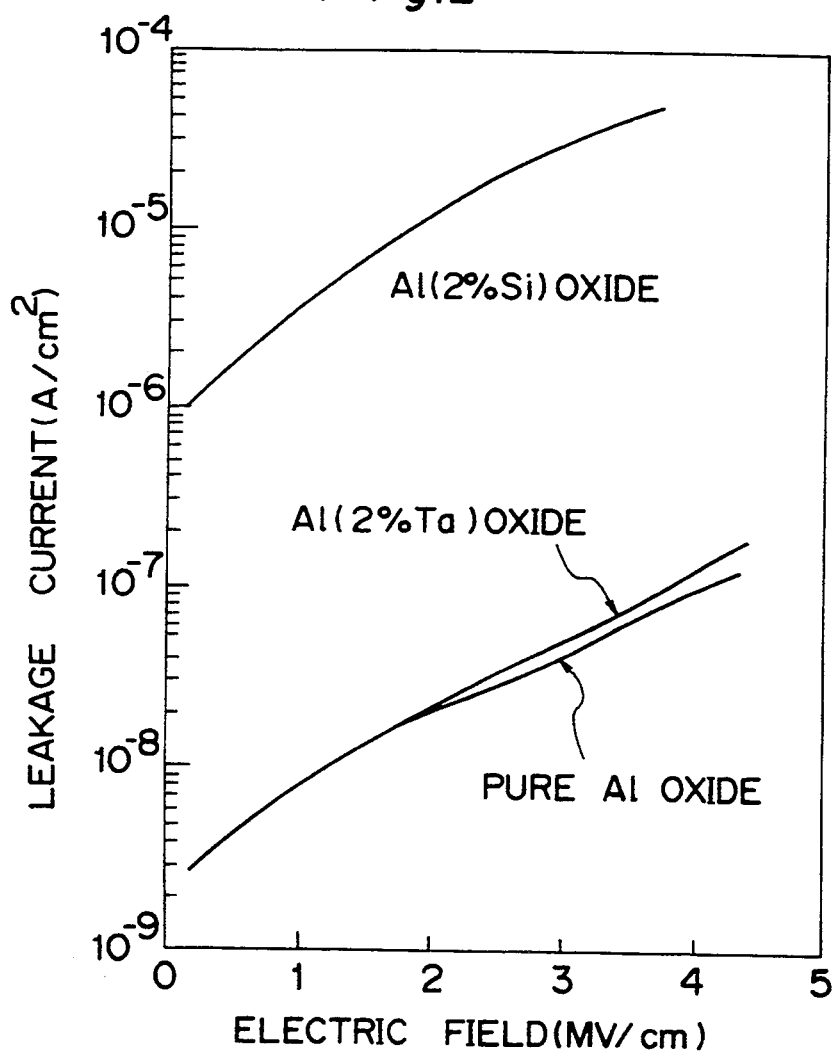
Fig. 2 is a graph indicating leakage currents of aluminum oxides with respect to the electric field.

According to this embodiment, because the gate electrode 2 is obtained using Al containing 2 atomic % of Ta, no hillocks are produced even after a heating treatment in the photolithography process. As a result, covering properties of the Al oxide, which is formed by the subsequent anodization process, are enhanced. As shown in FIG. 2, the leakage current of such Al oxide is substantially equal to that of an Al oxide formed by anodizing Al having a purity of 99.99%. In other words, the formation of the gate electrode with the use of Al containing 2 atomic % of Ta brings about no shortcircuiting between the gate electrode and the source or drain electrode, and enhances an yield in manufacturing TFT arrays. Furthermore, even after the SiNx has been formed at 300° C., no hillocks are produced, and the Al surface of a contact portion between the gate electrode and a source wiring does not fall to ruin, thus providing a desired electrical contact.

In the above-described embodiment, although Ta is employed as an impurity, substantially the same result is obtained by adding to Al any one of titanium (Ti), molybdenum (Mo), tungsten (W), hafnium (Hf), niobium (Nb), zirconium (Zr), and vanadium (V), in place of Ta.

A second embodiment of the present invention is discussed hereinafter with reference to FIG. 1 again.

A gate electrode 2 having a thickness of 300 nm and made of Al containing Ta is initially formed on a glass substrate 1. In the gate electrode 2, the concentration of Ta is gradually changed from 0 to 2 atomic % in a direction from the substrate side towards the upper surface of the gate electrode 2. In a subsequent anodization process, an Al oxide gate insulating layer 3 having a thickness of 150 nm is formed so as to cover the gate electrode 2. Then, an amorphous silicon semiconductor layer 5 is formed via a silicon nitride gate insulating film 4. On the gate insulating film 4 is also formed a transparent display electrode 8 for applying a voltage to liquid crystal. Thereafter, a source electrode 7a and a drain electrode 7b, each of which is comprised of a Ti layer and an Al layer, are formed via amorphous silicon semiconductor layers 6a and 6b each containing phosphorus, respectively. Finally, the drain electrode 7b is connected with the transparent display electrode 8.

In this embodiment, the gate electrode 2 is formed using an in-line DC sputtering apparatus wherein a first object of pure Al and a second object of Al containing 2 atomic % of Ta are disposed in spaced relationship in a direction of travel of a tray on which the glass substrate is placed. Then, while the tray together with the glass substrate is traveling, a coating of Al is evaporated over the surface of the glass substrate, and is selectively etched away. At this moment, no shielding object is interposed between the first and second objects. Other processes are the same as those carried out in the first embodiment.

According to this embodiment, because the gate electrode includes a low-concentration region of Ta at its lower portion, the wiring resistance thereof is reduced to less than a half of the wiring resistance of a single-layered Al gate electrode to which 2 atomic % of Ta has been added at a constant concentration.

Furthermore, because Ta having a high-melting point is added to Al as a whole, no hillocks are produced even after a heating treatment in the photolithography process. As a result, covering properties of the Al oxide formed in the subsequent anodization process is enhanced. The leakage current of the Al oxide is substantially equal to that of an Al oxide formed by anodizing Al having a purity of 99.99%. Accordingly, not only shortcircuiting is prevented from occurring between the gate electrode and the source or drain electrode, but also the TFTs can be manufactured at a high yield. Furthermore, even after SiNx has been formed at 300° C., hillocks are practically non-existent, and the Al surface of a contact portion between the gate electrode and a source wiring does not lie in ruins, thus providing a desired electrical contact.

In the above-described embodiment, although the concentration of Ta is gradually increased from 0 to 2 atomic % in a direction from the substrate side towards the upper surface of the gate electrode, it may be gradually increased in the reverse direction.

A third embodiment of the present invention is discussed hereinafter with reference to FIG. 1 again.

In manufacturing the TFT array according to the third embodiment of the present invention, a gate electrode 2 (thickness: 200 nm) made principally of Al is initially formed on a glass substrate 1. In a subsequent anodization process, an Al oxide gate insulating layer 3 (thickness: 150 nm) containing Ta as an impurity is formed so as to cover the gate electrode 2. Then, an amorphous silicon semiconductor layer 5 is formed via an Si nitride gate insulating film 4 (thickness: 200 nm). On the gate insulating film 4 is also formed a transparent display electrode 8 (thickness: 100 nm), which is made of an ITO and is used to apply a voltage to liquid crystal. Thereafter, a source electrode 7a and a drain electrode 7b are formed via amorphous silicon semiconductor layers 6a and 6b (thickness: 500 nm) each containing phosphorus, respectively. Each of the source electrode 7a and the drain electrode 7b is of a double-layered structure including a Ti layer (thickness: 100 nm) and an Al layer (thickness: 700 nm). Finally, the drain electrode 7b is connected with the transparent display electrode 8.

More specifically, a first Al film (thickness: 100 nm) is initially formed on the glass substrate 1 and a second Al film (thickness: 100 nm) containing 2 atomic % of high-melting point Ta is superimposed over the surface of the first Al film utilizing the DC sputtering process. The two Al films are then configured into a double-layered gate electrode 2 by the use of the photolithography technique and by etching. Thereafter, the whole second Al film containing 2 atomic % of Ta and formed at the upper layer of the gate electrode 2 is completely anodized into the Al oxide gate insulating film (thickness: 150 nm). Accordingly, the anodized film contains Ta as an impurity. At this moment, a mixed solution obtained by mixing a 3% solution of ammonium borate in water with ethylene glycol at a mixing ratio of 1:9 is preferably used as an anodizing solution. The anodizing solution is then neutralized so as to have a PH of 6-7 and the temperature thereof is maintained at 30° C. During the anodization process, the anodizing voltage and the anodizing current are chosen to be 105 V and 5 mA/cm$^2$, respectively. Other processes after the anodization process are the same as those carried out in the first embodiment.

According to this embodiment, because the gate electrode is formed using an Al film covered with another Al film containing 2 atomic % of Ta, the generation of hillocks is prevented even after a heating treatment in the photolithography process, thereby enhancing covering properties of the Al oxide formed in the subsequent anodization process. The leakage current of such Al oxide is substantially equal to that of an Al oxide formed by anodizing Al having a purity of 99.99%. Accordingly, not only shortcircuiting is prevented from occurring between the gate electrode and the source or drain electrode, but also the TFTs can be manufactured at a high yield. Furthermore, even after SiNx has been formed at 300° C., hillocks are practically non-existent, and the Al surface of a contact portion between the gate electrode and a source wiring does not lie in ruins, thus providing a desired electrical contact.

FIG. 3 depicts a portion of a TFT array according to a fourth embodiment of the present invention. As shown in FIG. 3, an Si nitride passivation film 9 having a thickness of 100 nm is formed on an amorphous silicon semiconductor layer 5 constituting channel portions. The other construction is the same as that of the TFT array shown in FIG. 1.

The TFT array of FIG. 3 is manufactured as follows. Similar to the manufacture of the TFT array of FIG. 1, an Al film containing 2 atomic % of Ta is initially formed on a glass substrate 1 utilizing the DC sputtering process. The Al film is then configured into a gate electrode 2 by the photolithography and by etching. Thereafter, a first gate insulating layer 3 is formed by anodizing the gate electrode 2. Then, the main materials of the TFT, i.e., a second gate insulating film 4 of an Si nitride (SiNx), an amorphous silicon (a-Si) semiconductor layer 5, and an Si nitride passivation film 9 are successively formed in this order utilizing the plasma CVD method. Thereafter, as shown in FIG. 3, the passivation film 9 is selectively etched into a plurality of pieces or segments. After the passivation film 9 and the amorphous silicon semiconductor layer 5 has been entirely covered with an amorphous silicon (n$^+$-a-Si) semiconductor layer containing phosphorus, unnecessary portions of the a-Si layer and those of the n$^+$-a-Si layer are then removed by etching. Thereafter, an ITO film is formed and configured into a transparent display electrode 8 by the photolithography and by etching. Then, a Ti film and an Al film are successively formed in this order and are configured into source and drain electrodes 7a and 7b by the photolithography and by etching. Finally, upon removing the n+-a-Si layer left on the passivation film 9, the TFT array is completed.

As is the case with the first embodiment, in the TFT array according to the fourth embodiment, because no hillocks are produced and the anodized film brings about a reduced leakage current, it is unlikely that shortcircuiting may occur between the gate electrode and the source or drain electrode. As a result, TFT arrays having channel portions on which the passivation films are formed can be manufactured at a high yield.

FIG. 4 depicts a portion of a TFT array according to a fifth embodiment of the present invention.

On a glass substrate 1 is initially formed a gate electrode of a double-layered structure including a first Al layer 2a containing 1 atomic % of Si and a second Al layer 2b containing 2 atomic % of Ta. The first layer 2a may contain copper (Cu) instead of Si or a mixture of Cu and Si. Then, an amorphous silicon semiconductor layer 5 is formed via an Si nitride gate insulating layer 4, and thereafter, a transparent display electrode 8 for applying a voltage to liquid crystal is formed. Furthermore, a source electrode 7a and a drain electrode 7b each having a Ti layer and an Al layer are formed via amorphous silicon semiconductor layers 6a and 6b each containing phosphorus, respectively. Finally, the drain electrode 7b is connected with the transparent display electrode 8.

More specifically, an Al film 2a containing 1 atomic % of Si and having a thickness of 100 nm is initially formed on a glass substrate 1. Then, an Al film 2b containing 2 atomic % of Ta and having a thickness of 200 nm is superimposed on the Al film 2a utilizing the DC sputtering process. These Al films 2a and 2b are configured into a gate electrode 2 by the photolithography technique and by etching. Thereafter, the surface of the gate electrode 2 is anodized so that an Al oxide gate insulating layer 3 having a thickness of 150 nm is formed on the gate electrode 2. At this moment, an anodizing solution is used which is obtained by mixing a 3% solution of ammonium borate in water with ethylene glycol at a mixing ratio of 1:9. The anodizing solution is then neutralized so as to have a PH of 6-7 and the temperature thereof is maintained at 30° C. The subsequent anodization process is performed at an anodizing voltage of 105 V and an anodizing current of 5 mA/cm$^2$.

Thereafter, the main materials of the TFT, i.e., the second gate insulating film 4 of SiNx, the amorphous silicon (a-Si) semiconductor layer 5, and the amorphous silicon (n+-a-Si) semiconductor layers 6a and 6b each containing phosphorus are successively formed utilizing the plasma CVD method at a frequency of 13.56 MHz. Then, the amorphous silicon semiconductor layer 5 and the amorphous silicon semiconductor layers 6a and 6b each containing phosphorus are selectively etched into a plurality of pieces or segments using a mixed solution of hydrofluoric acid and nitric acid. Thereafter, an ITO film is formed and is configured into a transparent display electrode by the photolithography technique. Then, a Ti film and an Al film are formed in this order and are configured into the source and drain electrodes 7a and 7b by the photolithography technique. Upon removing the phosphorus-containing amorphous silicon semiconductor layer left on the amorphous silicon semiconductor layer 5 of TFT channel portions, the TFT array is completed.

Figure 5:
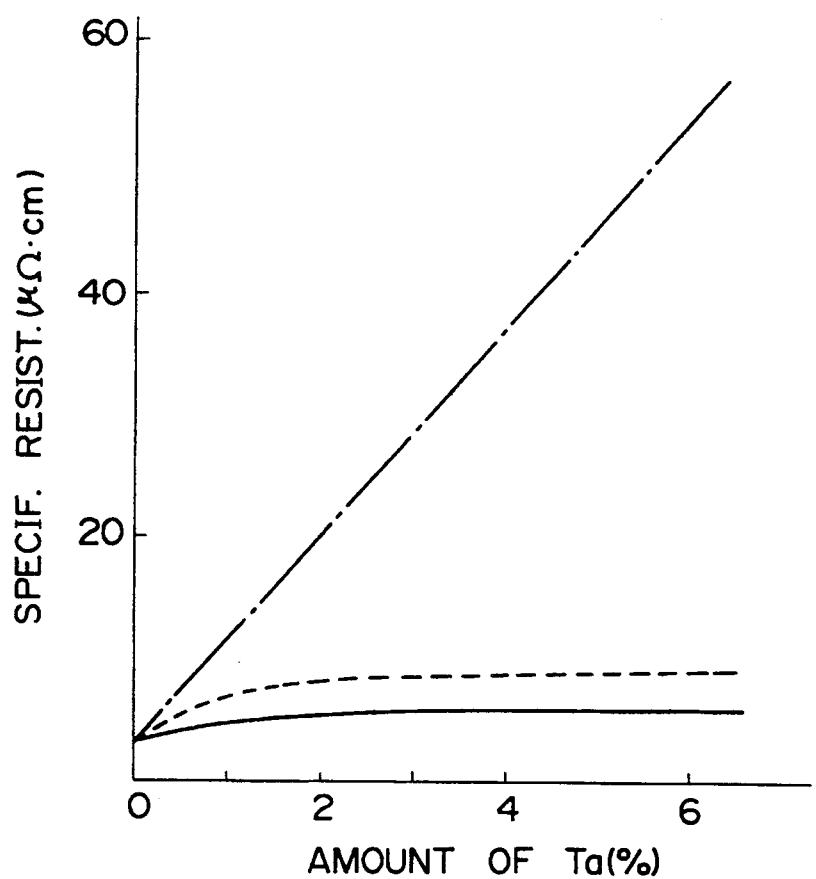
Fig. 5 is a graph indicating a relationship between the specific resistance and the amount of Ta contained in a gate electrode.

As shown in FIG. 5, according to this embodiment, the wiring resistance of the double-layered gate electrode is reduced to less than a half of the wiring resistance of a single-layered Al gate electrode containing Ta. In FIG. 5, a single dotted chain line indicates the specific resistance of a single-layered Al gate electrode containing Ta, whereas a dotted line indicates that of a double-layered gate electrode having a first Al layer (thickness: 100 nm) containing Ta and a second Al layer (thickness: 100 nm) containing Si. A solid line indicates the specific resistance of a double-layered gate electrode having an Al layer (thickness: 100 nm) containing Ta and a pure Al layer (thickness: 100 nm).

Furthermore, because the gate electrode is formed of Al containing 2 atomic % of Ta at an upper layer, no hillocks are produced even after a heat treatment in the photolithography process, thereby enhancing covering properties of the Al oxide formed by the anodization process. The leakage current of the Al oxide obtained in this way is substantially equal to that of an Al oxide formed by anodizing Al having a purity of 99.99%. As a result, no shortcircuiting occurs between the gate electrode and the source or drain electrode and an yield at the time the TFT arrays are manufactured is enhanced. Furthermore, even after the formation of SiNx at 300° C., no hillocks are produced, and the Al surface of a contact portion between gate electrode and a source wiring does not fall to ruin, thus providing a desired electrical contact.

In the fifth embodiment, Al containing 1 atomic % of Si may be replaced by pure Al. In this case, the wiring resistance of the double-layered gate electrode is reduced to about a quarter of the wiring resistance of the single-layered Al gate electrode containing Ta. Furthermore, in etching Al containing a high-melting point metal overlaying the layer 2a, even if the high-melting point metal is left on the surface without being etched, such metal is automatically removed at the same time when pure Al in the lower layer 2a is being etched.

Figure 6:
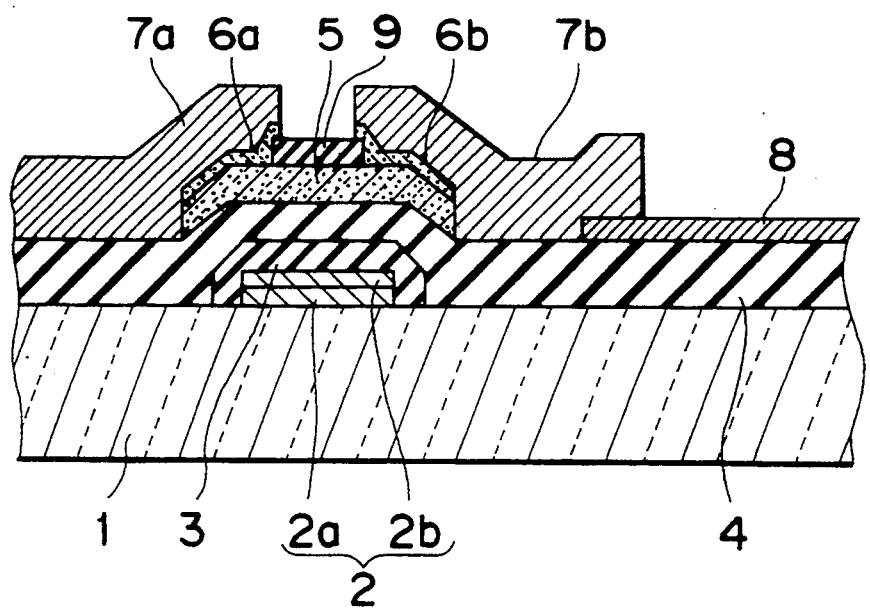
FIG. 6 is a view similar to FIG. 1, but according to a sixth embodiment of the present invention.

FIG. 6 depicts a portion of a TFT array according to a sixth embodiment of the present invention. As shown in FIG. 6, an Si nitride passivation film 9 is formed on an amorphous silicon semiconductor layer 5 constituting channel portions of the TFT. The other construction is the same as that of the TFT shown in FIG. 4.

As is the case with the fifth embodiment, the TFT array according to the sixth embodiment of the present invention is free from the generation of hillocks without increasing the wiring resistance and contributes to the formation of an anodized film with a low leakage current. Accordingly, no shortcircuiting occurs between the gate electrode and the source or drain electrode, and the TFT array having the channel portions on which the passivation films are formed can be readily manufactured.

It is to be noted that, in the above-described several embodiments, each of the amorphous silicon semiconductor layers may be replaced by a polycrystalline silicon semiconductor layer.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be construed as being included therein.

What is claimed is:

1. A thin-film transistor array suited for use in a liquid crystal display, said thin-film transistor array comprising:

a substrate;

a first electrically conductive layer made principally of aluminum and selectively formed on one surface of said substrate, said first electrically conductive layer containing, as an impurity, a high-melting point metal which can be anodized;

an oxide layer formed by an anodization process on said first electrically conductive layer;

a first insulating layer formed on said oxide layer so as to overlay said substrate;

a first non-monocrystalline semiconductor layer made principally of silicon and selectively formed on said insulating layer, a portion of said first non-monocrystalline semiconductor layer being positioned above said first electrically conductive layer;

a pair of second non-monocrystalline semiconductor layers made principally of silicon containing phosphorus, said second non-monocrystalline semiconductor layers being formed on said first non-monocrystalline semiconductor layer; and a pair of second electrically conductive layers formed on said pair of second non-monocrystalline semiconductor layers, respectively, at least a portion of each of said second electrically conductive layers being positioned above said first non-monocrystalline semiconductor layer.

2. The thin-film transistor array according to claim 1, wherein said high-melting point metal is any one of tantalum, titanium, molybdenum, tungsten, hafnium, niobium, zirconium, and vanadium.

3. The thin-film transistor array according to claim 1, further comprising a second insulating layer selectively formed on said first non-monocrystalline semiconductor layer.

4. A thin-film transistor array suited for use in a liquid crystal display, said thin-film transistor array comprising:

a substrate;

a first electrically conductive layer made principally of aluminum and selectively formed on one surface of said substrate, said first electrically conductive layer containing, as an impurity, a high-melting point metal which can be anodized, said first electrically conductive layer has a gradient in concentration of said high-melting point metal, which gradually changes in a direction perpendicular thereto;

an oxide layer formed by an anodization process on said first electrically conductive layer;

a first insulating layer formed on said oxide layer so as to overlay said substrate;

a first non-monocrystalline semiconductor layer made principally of silicon and selectively formed on said insulating layer, a portion of said first non-monocrystalline semiconductor layer being positioned above said first electrically conductive layer;

a pair of second non-monocrystalline semiconductor layers made principally of silicon containing phosphorus, said second non-monocrystalline semiconductor layers being formed on said first non-monocrystalline semiconductor layer; and a pair of second electrically conductive layers formed on said pair of second non-monocrystalline semiconductor layers, respectively, at least a portion of each of said second electrically conductive layers being positioned above said first non-monocrystalline semiconductor layer.

5. The thin-film transistor array according to claim 4, wherein said high-melting point metal is any one of tantalum, titanium, molybdenum, tungsten, hafnium, niobium, zirconium, and vanadium.

6. The thin-film transistor array according to claim 4, further comprising a second insulating layer selectively formed on said first non-monocrystalline semiconductor layer.

7. A thin-film transistor array suited for use in a liquid crystal display, said thin-film transistor array comprising:

a substrate;

a first electrically conductive layer made principally of aluminum and selectively formed on one surface of said substrate;

an oxide layer formed by an anodization process on said first electrically conductive layer, said oxide layer containing, as an impurity, a high-melting point metal which can be anodized;

a first insulating layer formed on said oxide layer so as to overlay said substrate;

a first non-monocrystalline semiconductor layer made principally of silicon and selectively formed on said insulating layer, a portion of said first non-monocrystalline semiconductor layer being positioned above said first electrically conductive layer;

a pair of second non-monocrystalline semiconductor layers made principally of silicon containing phosphorus, said second non-monocrystalline semiconductor layers being formed on said first non-monocrystalline semiconductor layer; and a pair of second electrically conductive layers formed on said pair of second non-monocrystalline semiconductor layers, respectively, at least a portion of each of said second electrically conductive layers being positioned above said first non-monocrystalline semiconductor layer.

8. The thin-film transistor array according to claim 7, wherein said high-melting point metal is any one of tantalum, titanium, molybdenum, tungsten, hafnium, niobium, zirconium, and vanadium.

9. The thin-film transistor array according to claim 7, further comprising a second insulating layer selectively formed on said first non-monocrystalline semiconductor layer.

10. A thin-film transistor array suited for use in a liquid crystal display, said thin-film transistor array comprising:

a substrate;

a first electrically conductive layer having a double-layered structure including a first layer selectively formed on one surface of said substrate and a second layer formed on said first layer, said first layer being made of aluminum containing at least one of silicon and copper, said second layer being made of aluminum containing, as an impurity, a high-melting point metal which can be anodized;

an oxide layer formed by an anodization process on said first electrically conductive layer;

a first insulating layer formed on said oxide layer so as to overlay said substrate;

a first non-monocrystalline semiconductor layer made principally of silicon and selectively formed on said insulating layer, a portion of said first non-monocrystalline semiconductor layer being positioned above said first electrically conductive layer;

a pair of second non-monocrystalline semiconductor layers made principally of silicon containing phosphorus, said second non-monocrystalline semiconductor layers being formed on said first non-monocrystalline semiconductor layer; and a pair of second electrically conductive layers formed on said pair of second non-monocrystalline semiconductor layers, respectively, at least a portion of each of said second electrically conductive layers being positioned above said first non-monocrystalline semiconductor layer.

11. The thin-film transistor array according to claim 10, wherein said high-melting point metal is any one of tantalum, titanium, molybdenum, tungsten, hafnium, niobium, zirconium, and vanadium.

12. The thin-film transistor array according to claim 10, further comprising a second insulating layer selectively formed on said first non-monocrystalline semiconductor layer.

13. A thin-film transistor array suited for use in a liquid crystal display, said thin-film transistor array comprising:

a substrate;

a first electrically conductive layer having a double-layered structure including a first layer selectively formed on one surface of said substrate and a second layer formed on said first layer, said first layer being made of pure aluminum, said second layer being made of aluminum containing a high-melting point metal as an impurity;

an oxide layer formed by an anodization process on said first electrically conductive layer;

a first insulating layer formed on said oxide layer so as to overlay said substrate;

a first non-monocrystalline semiconductor layer made principally of silicon and selectively formed on said insulating layer, a portion of said first non-monocrystalline semiconductor layer being positioned above said first electrically conductive layer;

a pair of second non-monocrystalline semiconductor layers made principally of silicon containing phosphorus, said second non-monocrystalline semiconductor layers being formed on said first non-monocrystalline semiconductor layer; and a pair of second electrically conductive layers formed on said pair of second non-monocrystalline semiconductor layers, respectively, at least a portion of each of said second electrically conductive layers being positioned above said first non-monocrystalline semiconductor layer.

14. The thin-film transistor array according to claim 13, wherein said high-melting point metal is any one of tantalum, titanium, molybdenum, tungsten, hafnium, niobium, zirconium, and vanadium.

15. The thin-film transistor array according to claim 13, further comprising a second insulating layer selectively formed on said first non-monocrystalline semiconductor layer.

* * * * *